US012656698B2

(12) United States Patent
Sobolev et al.

(10) Patent No.: US 12,656,698 B2
(45) Date of Patent: Jun. 16, 2026

(54) SYSTEMS AND METHODS FOR GENERATING MULTIPLE ILLUMINATION SPOTS FROM A SINGLE ILLUMINATION SOURCE

(71) Applicant: ASML NETHERLANDS B.V., Veldhoven (NL)

(72) Inventors: Kirill Urievich Sobolev, Brookfield, CT (US); Krishanu Shome, Cheshire, CT (US)

(73) Assignee: ASML NETHERLANDS B.V., Veldhoven (NL)

( * ) Notice: Subject to any disclaimer, the term of this patent is extended or adjusted under 35 U.S.C. 154(b) by 147 days.

(21) Appl. No.: 18/720,609

(22) PCT Filed: Dec. 14, 2022

(86) PCT No.: PCT/EP2022/085773
§ 371 (c)(1),
(2) Date: Jun. 14, 2024

(87) PCT Pub. No.: WO2023/117611
PCT Pub. Date: Jun. 29, 2023

(65) Prior Publication Data
US 2025/0085646 A1      Mar. 13, 2025

Related U.S. Application Data

(60) Provisional application No. 63/293,260, filed on Dec. 23, 2021.

(51) Int. Cl.
*G03F 9/00* (2006.01)
(52) U.S. Cl.
CPC .......... *G03F 9/7065* (2013.01); *G03F 9/7069* (2013.01)

(58) Field of Classification Search
CPC ............................ G03F 9/7065; G03F 9/7069
(Continued)

(56) References Cited

U.S. PATENT DOCUMENTS

| | | | |
|---|---|---|---|
| 6,046,792 A | 4/2000 | Van Der Werf et al. | |
| 6,433,907 B1 * | 8/2002 | Lippert ................. | G02B 26/08 |
| | | | 359/201.1 |

(Continued)

FOREIGN PATENT DOCUMENTS

| | | |
|---|---|---|
| EP | 2202580 | 6/2010 |
| TW | 202135192 | 9/2021 |

(Continued)

OTHER PUBLICATIONS

International Search Report and Written Opinion issued in corresponding PCT Patent Application No. PCT/EP2022/085773, dated Mar. 29, 2023.

(Continued)

*Primary Examiner* — Md M Rahman
(74) *Attorney, Agent, or Firm* — Pillsbury Winthrop Shaw Pittman, LLP

(57) ABSTRACT

Spots of illumination directed at a target are described. Ghost reflections often prevalent in wafer alignment sensors are reduced or eliminated. First, second, and third optical elements are described. The first optical element receives illumination along a first axis, reflects a first portion of the illumination away from the first axis, and transmits a second portion of the illumination along the first axis. The second first optical element receives the first portion of the reflected illumination and at least partially reflects a third portion of the illumination along a second axis. The third first optical element receives and fully reflects a fourth portion of the illumination along a third axis. The second portion, third and fourth portions of the illumination are directed toward the (Continued)

target at different angles relative to each other to create three different spots of illumination.

20 Claims, 11 Drawing Sheets

(58) Field of Classification Search
USPC .......................................................... 356/401
See application file for complete search history.

(56) References Cited

U.S. PATENT DOCUMENTS

| | | | |
|---|---|---|---|
| 6,961,116 B2 | 11/2005 | Den Boef et al. | |
| 9,525,265 B2 * | 12/2016 | Chuang ................... | H01S 3/083 |
| 2002/0041377 A1 * | 4/2002 | Hagiwara ............... | G03F 7/706 |
| | | | 356/399 |
| 2003/0035091 A1 * | 2/2003 | Kohno ................ | G03F 7/70058 |
| | | | 355/71 |
| 2005/0185236 A1 * | 8/2005 | Kudo ................... | G02B 26/123 |
| | | | 359/205.1 |
| 2006/0066855 A1 | 3/2006 | Boef et al. | |
| 2006/0291022 A1 * | 12/2006 | Redmond ............ | G11B 7/1359 |
| 2011/0012851 A1 | 1/2011 | Ciesla et al. | |
| 2013/0077086 A1 * | 3/2013 | Chuang .................... | G03F 1/84 |
| | | | 372/5 |
| 2013/0083148 A1 * | 4/2013 | Miyatake ............. | G02B 26/125 |
| | | | 359/204.1 |
| 2014/0328457 A1 * | 11/2014 | Stutman ............... | A61B 6/4042 |
| | | | 378/36 |
| 2015/0036142 A1 | 2/2015 | Kandel et al. | |
| 2017/0307955 A1 * | 10/2017 | Rabb .................... | G02B 27/283 |
| 2018/0003630 A1 * | 1/2018 | Grunzweig ........ | G01N 21/4788 |
| 2020/0073255 A1 * | 3/2020 | Montilla ............. | G03F 7/70608 |
| 2020/0134773 A1 * | 4/2020 | Pinter ................ | G01N 21/8806 |
| 2020/0401053 A1 * | 12/2020 | Brouwer ............. | G03F 7/70616 |
| 2021/0132509 A1 * | 5/2021 | Huisman ............. | G03F 7/70641 |
| 2021/0271178 A1 * | 9/2021 | Huisman .............. | G03F 7/7085 |
| 2021/0318627 A1 * | 10/2021 | Elazhary .............. | G03F 9/7049 |
| 2023/0040124 A1 * | 2/2023 | Nienhuys ............. | G03F 7/7055 |
| 2023/0064193 A1 | 3/2023 | Tinnemans et al. | |

FOREIGN PATENT DOCUMENTS

| | | |
|---|---|---|
| WO | 2005/036619 | 4/2005 |
| WO | 2011/129458 | 10/2011 |
| WO | 2020/038629 | 2/2020 |
| WO | 2020/064290 | 4/2020 |
| WO | 2021/151775 | 8/2021 |
| WO | 2021/156069 | 8/2021 |

OTHER PUBLICATIONS

Anonymous, "Aligning multiple substrate alignment marks with only one scan" Research Disclosure, No. 496029, pp. 1-3 (2005).

* cited by examiner

SYSTEMS AND METHODS FOR GENERATING MULTIPLE ILLUMINATION SPOTS FROM A SINGLE ILLUMINATION SOURCE

CROSS-REFERENCE TO RELATED APPLICATIONS

This application is the U.S. national phase entry of PCT Patent Application No. PCT/EP2022/085773 which was filed on Dec. 14, 2022, which claims priority of U.S. Provisional Patent Application No. 63/293,260, which was filed on Dec. 23, 2021, and which is incorporated herein in its entirety by reference.

TECHNICAL FIELD

This description relates generally to generating multiple illumination spots from a single illumination source.

BACKGROUND

A lithographic projection apparatus can be used, for example, in the manufacture of integrated circuits (ICs). A patterning device (e.g., a mask) may include or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate includes a plurality of adjacent target portions to which the pattern is transferred successively by the lithographic projection apparatus, one target portion at a time. In one type of lithographic projection apparatus, the pattern on the entire patterning device is transferred onto one target portion in one operation. Such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating, and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, deposition, chemo-mechanical polishing, etc., all intended to finish the individual layer of the device. If several layers are required in the device, then the whole procedure, or a variant thereof, is repeated for each layer. Eventually, a device will be present in each target portion on the substrate. These devices are then separated from one another by a technique such as dicing or sawing, such that the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, deposition, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, deposition, etc.

Lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the number of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but are not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET).

SUMMARY

Multiple spots of illumination are generated with an arrangement of optical elements. The multiple spots of illumination may be used to illuminate multiple metrology marks and/or other targets at the same time, and/or for other purposes. The arrangement of optical elements is relatively low cost compared to other methods of generating multiple spots of illumination, and is compatible with existing metrology systems. Advantageously, the present systems and methods provide off axis illumination spots, which facilitate separation of ghost reflections from intensity channel measurements in such systems. Additional light paths are created in collimated space at different angles relative to each other, thus forming separate illumination spots on a target. The illumination spots can be arranged along one axis on the target, or in a two dimensional pattern, for example.

According to an embodiment, a system for generating spots of illumination configured to be directed at a target is provided. The system comprises a first optical element configured to receive illumination from an illumination source along a first axis, reflect a first portion of the illumination away from the first axis, and transmit a second portion of the illumination along the first axis. The system comprises a second optical element configured to receive the first portion of the reflected illumination and at least partially reflect a third portion of the illumination along a second axis that is at a different angle from the first axis. The second portion and the third portion of the illumination are directed toward the target at an angle relative to each other in a pupil plane to create two different spots of illumination on the target.

In some embodiments, the system comprises a third optical element configured to receive and fully reflect a fourth portion of the illumination along a third axis that is at a different angle from the first axis and the second axis. The fourth portion of the illumination is transmitted by the second optical element. The second portion, the third portion, and the fourth portion of the illumination are directed toward the target at different angles relative to each other in the pupil plane to create three different spots of illumination on the target.

In some embodiments, a spot of illumination corresponding to the illumination from the first axis comprises an on axis spot, and a spots of illumination corresponding to the illumination from the second and third axes comprise off axis spots. In some embodiments, an off-axis spot is configured to reduce or eliminate ghost reflections.

In some embodiments, the first optical element, the second optical element and the third optical elements are movable relative to each other. In some embodiments, movement of the first optical element, the second optical element, and/or the third optical element is configured to adjust locations of corresponding spots of illumination on the target. In some embodiments, movement comprises tilting the first optical element, the second optical element, and/or the third optical element; and/or changing a distance between one or more of the first optical element, the second optical element, and the third optical element.

In some embodiments, the first optical element, the second optical element, and the third optical element each comprise a spot mirror. In some embodiments, the first optical element is partially reflective, the second optical element is at least partially reflective, and the third optical element is fully reflective.

In some embodiments, the system comprises a fourth optical element. The fourth optical element is configured to reflect the illumination received along the first axis in a columnar direction that is substantially perpendicular to the first axis. In some embodiments, the fourth optical element comprises a spot mirror cube.

In some embodiments, a spot of illumination corresponding to the illumination from the first axis comprises an on axis spot, and a spots of illumination corresponding to the illumination from the second and third axes comprise off axis spots, and the on axis spot and the off axis spots are moveable relative to each other. In some embodiments, the spots of illumination directed at the target are configured to be moved relative to each other based on movements of the first, second, third, and/or fourth optical elements.

In some embodiments, the spots of illumination are aligned linearly. In some embodiments, the spots of illumination are arranged in a two dimensional pattern.

In some embodiments, the system comprises the illumination source. The illumination source comprises a single source configured to generate the illumination along the first axis.

In some embodiments, the system comprises a lens configured to receive illumination beams formed by the optical elements and focus the spots of illumination on the target.

In some embodiments, the first, second, third, and fourth optical elements form a portion of an alignment sensor, and the alignment sensor is a wafer alignment sensor that is used in a semiconductor manufacturing process.

In some embodiments, the system comprises additional optical elements configured to receive reflected illumination transmitted by previous optical elements, and configured to at least partially reflect received illumination along additional axes to generate additional spots of illumination directed at the target.

According to another embodiment, a method for generating spots of illumination configured to be directed at a target is provided. The method comprises: receiving, with a first optical element, illumination from an illumination source along a first axis, reflecting a first portion of the illumination away from the first axis, and transmitting a second portion of the illumination along the first axis; and receiving, with a second optical element, the first portion of the reflected illumination and at least partially reflecting a third portion of the illumination along a second axis that is at a different angle from the first axis. The second portion and the third portion of the illumination are directed toward the target at an angle relative to each other in a pupil plane to create two different spots of illumination on the target.

According to another embodiment, there is provided a non-transitory computer readable medium having instructions thereon, the instructions when executed by a computer, causing operations comprising: receiving, with a first optical element, illumination from an illumination source along a first axis, reflecting a first portion of the illumination away from the first axis, and transmitting a second portion of the illumination along the first axis; and receiving, with a second optical element, the first portion of the reflected illumination and at least partially reflecting a third portion of the illumination along a second axis that is at a different angle from the first axis. The second portion and the third portion of the illumination are directed toward a target at an angle relative to each other in a pupil plane to create two different spots of illumination on the target.

According to another embodiment, a system for generating spots of illumination configured to be directed at a target for a wafer alignment sensor used in a semiconductor manufacturing process is provided. The system is configured to generate multiple spots of illumination from a single illumination source. The system is configured to reduce or eliminate ghost reflections often prevalent in other wafer alignment sensors. The system comprises the single illumination source. The system comprises a first spot mirror included in a first glass plate. The first spot mirror is configured to receive illumination from the single illumination source along a first axis, reflect a first portion of the illumination away from the first axis, and transmit a second portion of the illumination along the first axis. The system comprises a second spot mirror included in a second glass plate. The second spot mirror is configured to receive the first portion of the reflected illumination and at least partially reflect a third portion of the illumination along a second axis that is different from the first axis. The system comprises a third spot mirror included in a third glass plate. The third spot mirror is configured to receive and fully reflect a fourth portion of the illumination along a third axis that is at a different angle from the first axis and the second axis. The fourth portion of the illumination is transmitted by the second spot mirror. The second portion, the third portion, and the fourth portion of the illumination are directed toward the target at different angles relative to each other in a pupil plane to create three different spots of illumination on the target corresponding to illumination on the first axis, the second axis, and the third axis.

BRIEF DESCRIPTION OF THE DRAWINGS

The above aspects and other aspects and features will become apparent to those ordinarily skilled in the art upon review of the following description of specific embodiments in conjunction with the accompanying figures.

DETAILED DESCRIPTION

Figure 1:
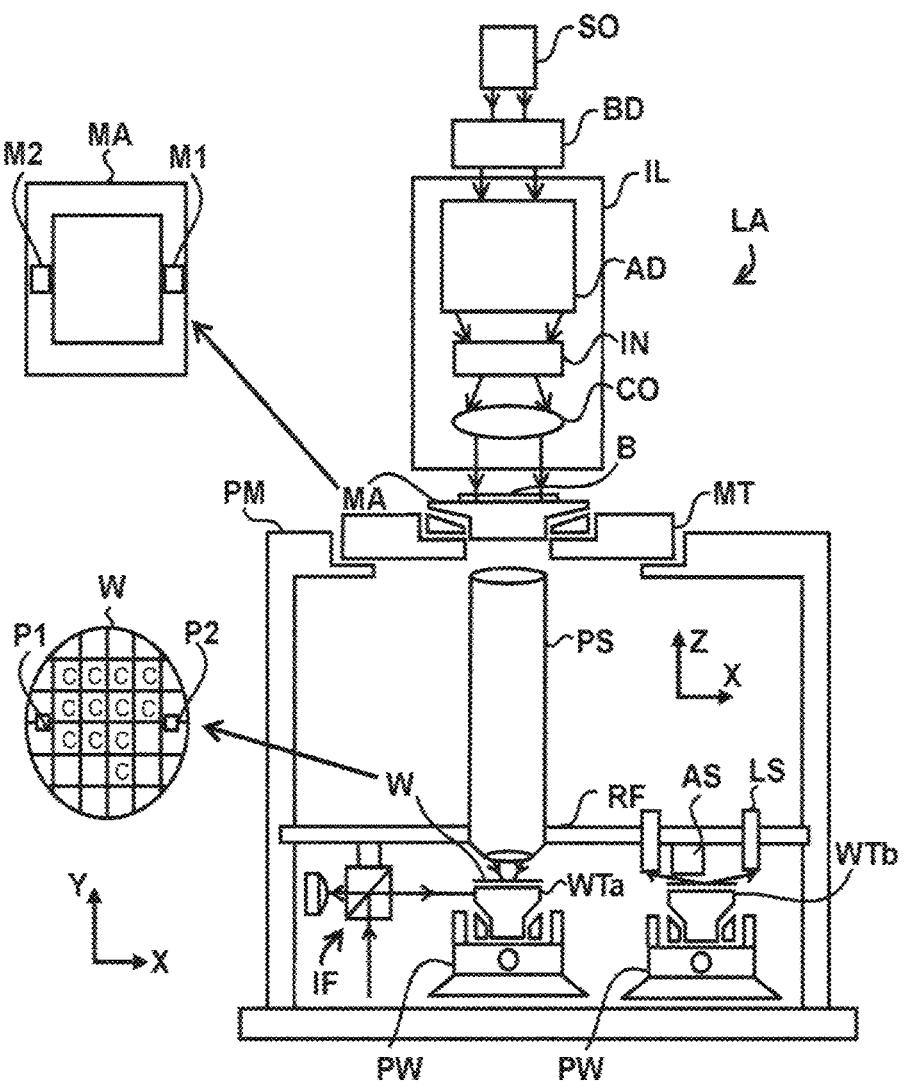
FIG. 1 schematically depicts a lithography apparatus, according to an embodiment.

In semiconductor device manufacturing, determining alignment typically includes determining the position of an alignment mark (or marks) and/or other target in a layer of a semiconductor device structure. Alignment is typically determined by irradiating an alignment mark with radiation, and comparing characteristics of different diffraction orders of radiation reflected from the alignment mark. Similar techniques are used to measure overlay and/or other parameters. Current alignment sensors have a single measurement illumination spot projected onto a substrate (e.g., a wafer). The single illumination spot is used for measurements of multiple alignment parameters, phase, and intensity detection. Current sensors measure metrology marks serially. Thus, the number of measured marks on a given substrate is limited by throughput considerations. In addition, the accuracy of mark detection is affected by ghost reflections within the sensor. The effect of ghost reflections is significant with current sensors, especially for intensity detection, which limits a sensor's ability to measure intensity precisely.

There is a need to measure more metrology marks more accurately and efficiently to enable higher order grid fits, for example, and/or for other reasons. A higher order grid fit allows one to determine wafer distortion more accurately by fitting higher order polynomials, which require a greater number of measurement points. Prior proposed solutions required significant redesign of sensor hardware, which is costly and risky, and typically were not backward compatible to existing sensors.

Advantageously, the present system(s) and method(s) generate multiple spots of illumination with an arrangement of optical elements. The multiple spots of illumination are used to illuminate one or more portions of a single metrology mark, multiple metrology marks, and/or other targets, at the same time, and/or may be used for other purposes. The arrangement of optical elements is relatively low cost compared to other methods of generating multiple spots of illumination, and is compatible with existing metrology systems. The present systems and methods provide off axis illumination spots, which facilitate separation of ghost reflections from intensity channel measurements in such systems. Additional light paths are created in collimated space at different angles relative to each other, thus forming separate illumination spots on a target. The illumination spots can be arranged along one axis on the target, or in a two dimensional pattern, for example.

By way of a brief introduction, the description herein relates generally to semiconductor device manufacturing and patterning processes. More particularly, the following paragraphs describe several components of systems and/or methods for semiconductor device manufacturing. These systems and methods may be used for measuring alignment in a semiconductor device manufacturing process, for example, or for other operations.

Although specific reference may be made in this text to the measurement of alignment and the manufacture of integrated circuits (ICs) for semiconductor devices, it should be understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

FIG. 1 schematically depicts an embodiment of a lithographic apparatus LA. The apparatus comprises an illumination system (illuminator) IL configured to condition a radiation beam B (e.g. UV radiation, DUV radiation, or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT (e.g., WTa, WTb or both) configured to hold a substrate (e.g. a resist-coated wafer) W and coupled to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies and often referred to as fields) of the substrate W. The projection system is supported on a reference frame RF. As depicted, the apparatus is of a transmissive type (e.g. employing a transmissive mask). Alternatively, the apparatus may be of a reflective type (e.g. employing a programmable mirror array, or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases, the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjuster AD configured to adjust the (angular/spatial) intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable to alter the polarization of the beam and may be operable to adjust the polarization using adjuster AD. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode, the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure may use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in a target portion of the device, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS may comprise a plurality of optical (e.g., lens) elements and may further comprise an adjustment mechanism configured to adjust one or more of the optical elements to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z, or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines, the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

In operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus may be used in at least one of the following modes. In step mode, the support structure MT and the substrate table WT are kept essentially stationary, while a pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed, and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already includes multiple processed layers.

The terms "radiation" and "beam" used herein with respect to lithography encompass all types of electromagnetic radiation, including ultraviolet (UV) or deep ultraviolet (DUV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. The process window of the patterns on a patterning device or an area thereof may be obtained by merging (e.g., overlapping) process windows of each individual pattern. The boundary of the process window of a group of patterns comprises boundaries of process windows of some of the individual patterns. In other words, these individual patterns limit the process window of the group of patterns.

Figure 2:
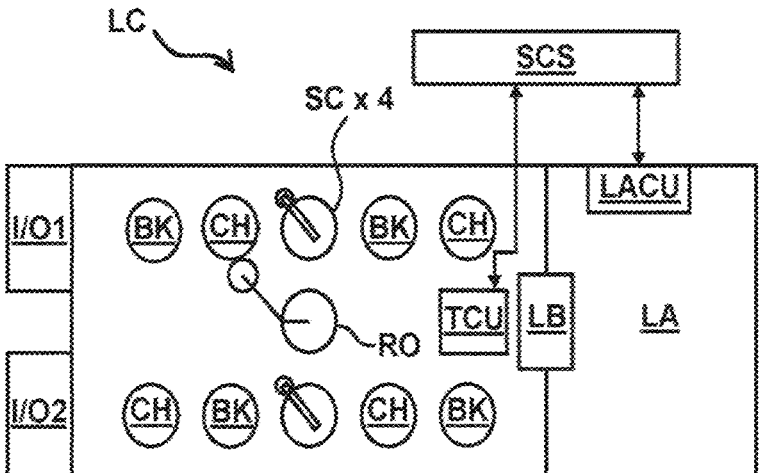
FIG. 2 schematically depicts an embodiment of a lithographic cell or cluster, according to an embodiment.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently and/or in order to monitor a part of the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. Accordingly, a manufacturing facility in which lithocell LC is located also typically includes a metrology system that measures some or all of the substrates W (FIG. 1) that have been processed in the lithocell or other objects in the lithocell. The metrology system may be part of the lithocell LC, for example it may be part of the lithographic apparatus LA (such as alignment sensor AS (FIG. 1)).

The one or more measured parameters may include, for example, alignment, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement is often performed on a dedicated metrology target provided on the substrate. The measurement can be performed after-development of a resist but before etching, after-etching, after deposition, and/or at other times.

There are various techniques for making measurements of the structures formed in the patterning process, including the use of a scanning electron microscope, an image-based measurement tool and/or various specialized tools. A fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. Traditionally, this may be termed diffraction-based metrology. One such application of this diffraction-based metrology is in the measurement of alignment. For example, alignment can be measured by comparing parts of the diffraction spectrum (for example, comparing different diffraction orders in the diffraction spectrum of a periodic grating).

Thus, in a device fabrication process (e.g., a patterning process or a lithography process), a substrate or other objects may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as the ASML YieldStar metrology tool, the ASML SMASH metrology system), mechanical measurement (e.g., profiling using a stylus, atomic force microscopy (AFM)), and/or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which meet specifications. Other manufacturing process adjustments are contemplated.

A metrology system may be used to determine one or more properties of the substrate structure, and in particular, how one or more properties of different substrate structures vary, or different layers of the same substrate structure vary from layer to layer. The metrology system may be integrated into the lithographic apparatus LA or the lithocell LC, or may be a stand-alone device.

To enable the metrology, often one or more targets are specifically provided on the substrate. A target may include an alignment mark, for example, and/or other targets. Typically, the target is specially designed and may comprise a periodic structure. For example, the target on a substrate may comprise one or more 1-D periodic structures (e.g., geometric features such as gratings), which are printed such that after development, the periodic structural features are formed of solid resist lines. As another example, the target may comprise one or more 2-D periodic structures (e.g., gratings), which are printed such that after development, the one or more periodic structures are formed of solid resist pillars or vias in the resist. The bars, pillars, or vias may alternatively be etched into the substrate (e.g., into one or more layers on the substrate).

Figure 3:
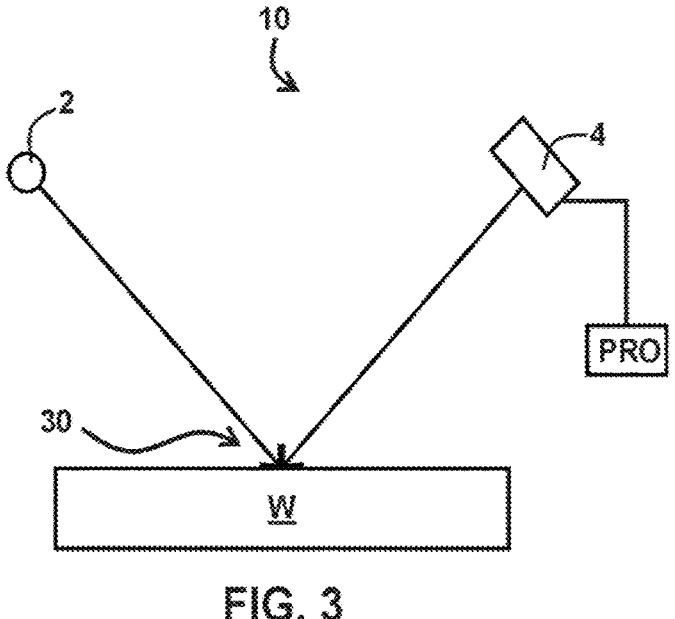
FIG. 3 schematically depicts an example inspection system, according to an embodiment.
Figure 4:
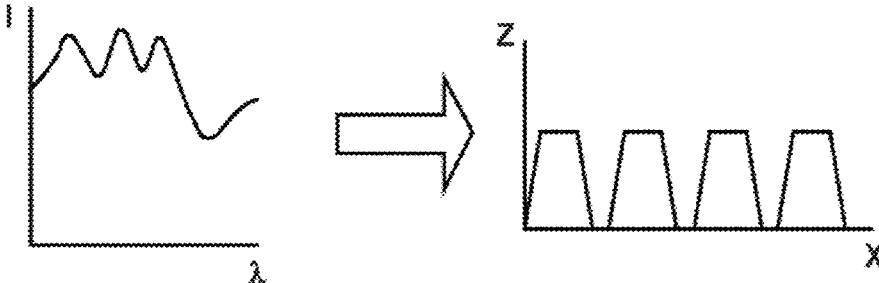
FIG. 4 schematically depicts an example metrology technique, according to an embodiment.

FIG. 3 depicts an example inspection system 10 that may be used to detect alignment and/or perform other metrology operations. It comprises a radiation or illumination source 2 which projects or otherwise irradiates radiation onto a substrate W (e.g., which may typically include an alignment mark). The redirected radiation is passed to a sensor such as a spectrometer detector 4 and/or other sensors, which measures a spectrum (intensity as a function of wavelength) of the specular reflected and/or diffracted radiation, as shown, e.g., in the graph on the left of FIG. 4. The sensor may generate an alignment signal conveying alignment data indicative of properties of the reflected radiation. From this data, the structure or profile giving rise to the detected spectrum may be reconstructed by one or more processors PRO, a generalized example of which is shown in FIG. 4, or by other operations.

As in the lithographic apparatus LA in FIG. 1, one or more substrate tables (not shown in FIG. 4) may be provided to hold the substrate W during measurement operations. The one or more substrate tables may be similar or identical in form to the substrate table WT (WTa or WTb or both) of FIG. 1. In an example where inspection system 10 is integrated with the lithographic apparatus, they may even be the same substrate table. Coarse and fine positioners may be provided and configured to accurately position the substrate in relation to a measurement optical system. Various sensors and actuators are provided, for example, to acquire the position of a target portion of interest of a structure (e.g., an alignment mark), and to bring it into position under an objective lens. Typically, many measurements will be made on target portions of a structure at different locations across the substrate W. The substrate support can be moved in X and Y directions to acquire different targets, and in the Z direction to obtain a desired location of the target portion relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and the substrate moves. Provided the relative position of the substrate and the optical system is correct, it does not matter in principle which one of those is moving, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

For typical alignment measurements, a target (portion) 30 on substrate W may be a 1-D grating, which is printed such that after development, the bars are formed of solid resist lines (e.g., which may be covered by a deposition layer), and/or other materials. Or the target 30 may be a 2-D grating, which is printed such that after development, the grating is formed of solid resist pillars, and/or other features in the resist.

The bars, pillars, vias, and/or other features may be etched into or on the substrate (e.g., into one or more layers on the substrate), deposited on a substrate, covered by a deposition layer, and/or have other properties. Target (portion) 30 (e.g., of bars, pillars, vias, etc.) is sensitive to changes in processing in the patterning process (e.g., optical aberration in the lithographic projection apparatus such as in the projection system, focus change, dose change, etc.) such that process variation manifests in variation in target 30. Accordingly, the measured data from target 30 may be used to determine an adjustment for one or more of the manufacturing processes, and/or used as a basis for making the actual adjustment.

For example, the measured data from target 30 may indicate alignment for a layer of a semiconductor device. The measured data from target 30 may be used (e.g., by the one or more processors PRO and/or other processors) for determining one or more semiconductor device manufacturing process parameters based the alignment, and determining an adjustment for a semiconductor device manufacturing apparatus based on the one or more determined semiconductor device manufacturing process parameters. In some embodiments, this may comprise a stage position adjustment, for example, or this may include determining an adjustment for a mask design, a metrology target (e.g., an alignment mark) design, a semiconductor device design, an intensity of the radiation, an incident angle of the radiation, a wavelength of the radiation, a pupil size and/or shape, a resist material, and/or other process parameters.

Angle resolved scatterometry is useful in the measurement of asymmetry of features in product and/or resist patterns. A particular application of asymmetry measurement is for the measurement of alignment. The base concepts of asymmetry measurement using system 10 of FIG. 3 are described, for example, in U.S. patent application publication US2006-066855, which is incorporated herein in its entirety. In brief, for an alignment measurement, the positions of the diffraction orders in the diffraction spectrum of the target are determined by the periodicity of the target (e.g., alignment mark). Asymmetry in the diffraction spectrum is indicative of asymmetry in the individual features which make up the target.

Figure 5:
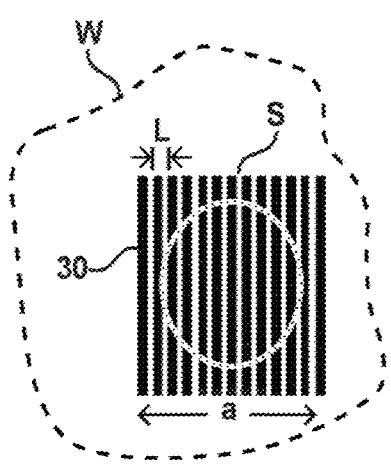
FIG. 5 illustrates the relationship between a radiation illumination spot of an inspection system and a metrology target, according to an embodiment.

FIG. 5 illustrates a plan view of a typical target (e.g., alignment mark) 30, and the extent of a typical radiation illumination spot S in the system of FIG. 4. Typically, to obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target, in other words, is 'underfilled' by the illumination, and the diffraction signal is essentially free from any signals from product features and the like outside the target itself. The illumination arrangement may be configured to provide illumination of a uniform intensity across a back focal plane of an objective, for example. Alternatively, by, for example, including an aperture in the illumination path, illumination may be restricted to on axis or off axis directions.

Figure 6:
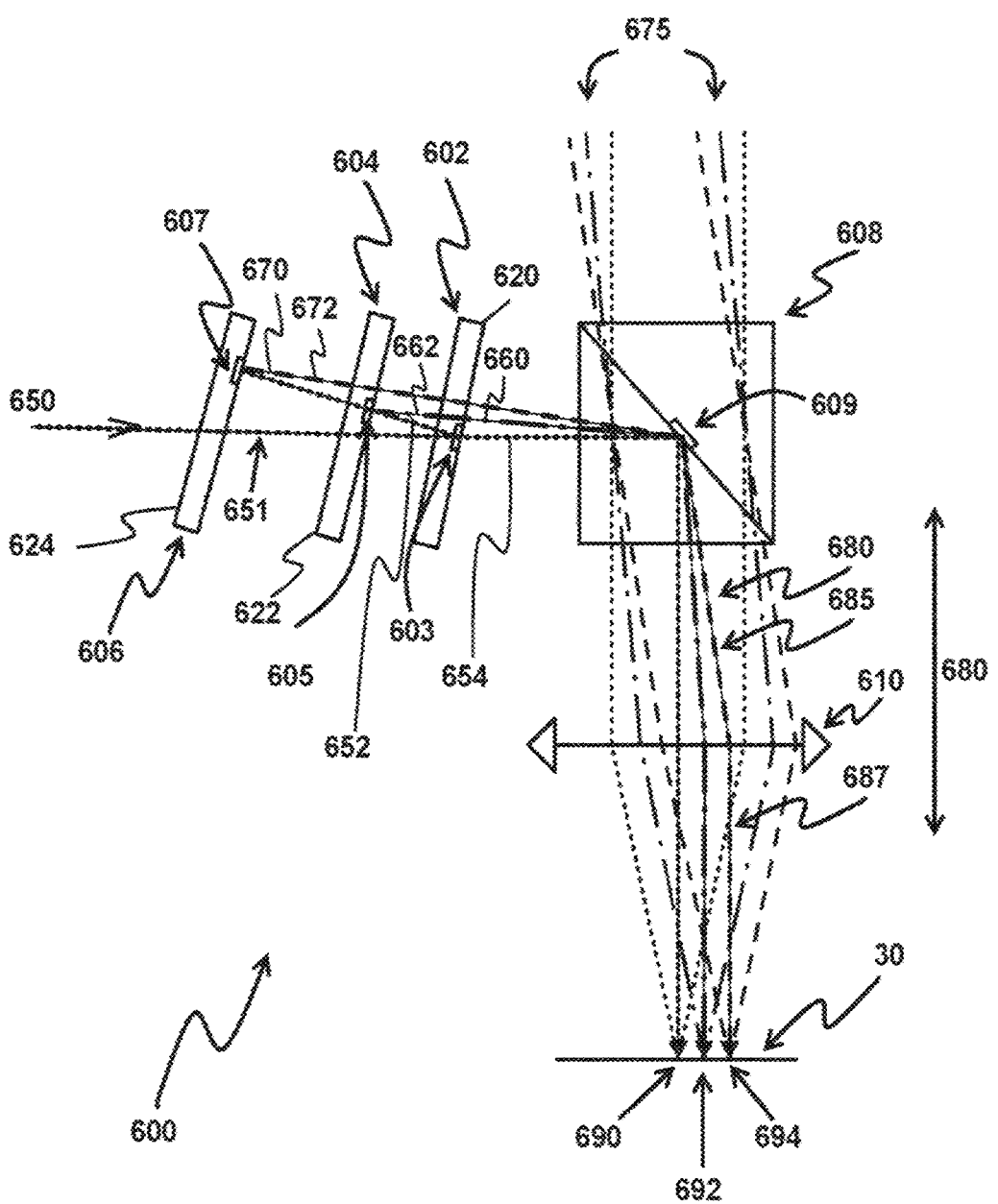
FIG. 6 illustrates a system for generating spots of illumination configured to be directed at a target, according to an embodiment.

FIG. 6 illustrates a system 600 configured for generating spots of illumination configured to be directed at a target. The illumination may comprise light and/or other radiation. The target may comprise one or more metrology marks, for example. System 600 may form a portion of system 10 described above with respect to FIG. 3. System 600 may be a subsystem of system 10, for example. In some embodiments, one or more components of system 600 may be similar to and/or the same as one or more components of system 10. In some embodiments, one or more components of system 600 may replace, be used with, and/or otherwise augment one or more components of system 10. System 600 is configured to generate multiple spots of illumination from a single illumination source (e.g., source 2 shown in FIG. 3). System 600 is also configured to reduce or eliminate ghost reflections often prevalent in other wafer alignment sensors, and/or have other advantages.

FIG. 6 shows system 600 generating multiple measurement spots (e.g., as discussed below). Multiple spots are created by the arrangement of parallel (in this example) optical elements with partially and fully reflective spot mirrors, in combination with a cube spot mirror. Additional light paths are created in collimated space at different angles, thus forming separate spots on a substrate. The example implementation shown in FIG. 6 creates two off axis illuminations spots in addition to a main on axis spot. Additional illumination spots can be arranged along an axis of the substrate, or in a two dimensional pattern (also as discussed below). The number of additional illumination spots is not limited to three as illustrated. Multiple optical elements can be used to create additional spots. These and other features of system 600 are described in more detail below.

System 600 comprises a first optical element 602, a second optical element 604, a third optical element 606, a fourth optical element 608, a lens 610, and/or other components. In some embodiments, the first, second, third, and fourth optical elements 602-608; lens 610; and or other components of system 600 form a portion of an alignment sensor that is used in a semiconductor manufacturing process. The alignment sensor may be a wafer alignment sensor, for example, used as described above. In some embodiments, system 600 may have other uses including, for example, in any metrology system that requires multiple illumination spots on a target generated from a single illumination beam.

In some embodiments, first optical element 602, second optical element 604, third optical element 606, and/or fourth optical element 608 each comprise a localized reflective and/or transmissive surface. For example, optical elements 602-608 may each comprise a spot mirror 603, 605, 607, and/or 609 respectively. A spot mirror comprises a relatively small reflective and/or transmissive surface. For example, a spot mirror may have a diameter that is just larger than, or otherwise corresponds to, a size of a beam of illumination from the illumination source). Spot mirrors 603-609 may be formed by coated portions of optical elements 602-608, devices inserted in and/or coupled to optical elements 602-608, other localized reflective and/or transmissive surfaces, and/or other components. For example, a reflective spot mirror also can be formed by a local TIR (total internal reflection) region. In some embodiments, optical elements 602-608 comprise a filter configured to control the wavelengths and/or other properties of the illumination reflected and/or transmitted by each optical element 602-608. The filter may comprise a specific coating, and/or other components coupled to or included in one or more of optical elements 602-608.

In some embodiments, optical elements 602, 604, and/or 606 each comprise an optically transparent plate, 620, 622, 624 respectively, that is coupled to and/or includes a corresponding spot mirror 603, 605, or 607. A plate 620, 622, and/or 624 comprises an optically transparent material. Plates 620, 622, and/or 624 may be formed from any transparent material such as glass, crystal, and/or other optically transparent materials. Plates 620, 622, and/or 624 may have a round cross-sectional shape, a square cross sectional shape, a rectangular cross sectional shape, and/or other cross-section shapes. Plates 620, 622, and/or 624 may have a certain thickness and/or other characteristics. The shape and/or dimensions of plates 620, 622, and/or 624 may be determined by a user, for example, based on the material used for plates 620, 622, and/or 624, the application (e.g., measuring alignment) plates 620, 622, and/or 624 are used for, optical behavior requirements of a plate 620, 622, and/or 624, handling and/or movement requirements of a plate 620, 622, and/or 624, and/or based on other factors. It should be noted however that, in some embodiments, plates 620-624 are optional, and only spot mirrors 603-607 are included in system 600.

In some embodiments, first optical element 602 is or has a portion (e.g., spot mirror 603) that is partially reflective, second optical element 604 is or has a portion (e.g., spot mirror 605) that is at least partially reflective, and third optical element 606 is or has a portion (e.g., spot mirror 607) that is fully reflective. A partially reflective portion may comprise a surface that reflects at least some radiation incident on the surface, and transmits a different portion through the surface.

For example, first optical element 602 including spot mirror 603 is configured to receive illumination 650 (e.g., directed radiation) from an illumination source (e.g., source 2 shown in FIG. 3) along a first axis 651 at spot mirror 603, reflect a first portion 652 of the illumination away from first axis 651, and transmit a second portion 654 of illumination 650 along first axis 651. Second optical element 604 including spot mirror 605 is configured to receive first portion 652 of the reflected illumination and at least partially reflect a third portion 660 of the illumination along a second axis 662 that is at a different angle from first axis 651. Third optical element 606 including spot mirror 607 is configured to receive and fully reflect a fourth portion 670 of the illumination along a third axis 672 that is at a different angle from first axis 651 and second axis 662. Fourth portion 670 of the illumination is transmitted by spot mirror 605 of second optical element 604, as shown in FIG. 6.

Second portion 654, third portion 660, and fourth portion 670 of the illumination are directed 680 toward target 30 at different angles relative to each other in the pupil plane to create three different spots 690, 692, 694 of illumination 650 on target 30. Target 30 may be one or more metrology marks on a semiconductor wafer, as described herein, for example.

Fourth optical element 608 may include spot mirror 609 and/or other reflective or at least partially reflective surfaces. In some embodiments, fourth optical element 608 comprises a transmissive optical element. In some embodiments, fourth optical element 608 comprises a spot mirror cube, for example. A spot mirror cube may comprise two prisms joined by optical contact or glue (or other coupling mechanisms) to form a cube or rhomboid with a local reflective region at the joint surface. The reflective region can be formed by a reflective coating or TIR, that is part of the surface with an air pocket (or other optical material with lower index of refraction) behind it causing light to reflect inside the optical material with a higher index of refraction. A spot mirror cube is configured to reflect light incident on the spot mirror (in the cube) in order to change its direction, and transmit other light. Its purpose here is to change the direction of one selected beam(s) differently from the other beams passing through the optical element. Fourth optical element 608 including spot mirror 609 is configured to reflect the illumination received along first axis 651, second axis 662, and third axis 672, in a columnar direction 680 that is substantially perpendicular to first axis 651.

As shown in FIG. 6, lens 610 is configured to receive illumination beams 685 formed by optical elements 602-608 and focus 687 spots 690, 692, and 694 of illumination 650 on target 30. Lens 610 may comprise any type of lens configured to function as described. For example, lens 610 may be an objective lens. Lens 610 may be formed from any transparent material and have curved surfaces configured to concentrate or otherwise focus beams 685. In some embodiments, spot 690 of illumination 650 corresponding to the illumination from first axis 651 comprises an on axis spot, and a spots 692 and 694 of illumination 650 corresponding to the illumination from second and third axes 662 and 672 comprise off axis spots. An off-axis spot (e.g., 692 and/or 694) is configured to reduce or eliminate ghost reflections, and/or have other advantages. Ghost reflections comprise unwanted reflections from one or more optical surfaces perpendicular to an illumination axis or direction in collimated space. Ghost reflections are reduced and/or eliminated because the illumination that forms these spots is not perpendicularly incident on one or more surfaces (e.g., a cube surface) of optical element 608, and/or other surfaces of optical elements in system 600.

Optical elements 602-608 may be positioned in any location and/or at any angle relative to each other that allows system 600 to function as described herein. This may include positioning at specific relative distances between elements, specific angles between elements, etc. In some embodiments, two or more of optical elements 602-608 are positioned parallel relative to each other in system 600 (e.g., as shown in FIG. 6). In some embodiments, one or more of optical elements 602-608 are positioned at an angle relative to one or more of the other optical elements in system 600.

In some embodiments, optical elements 602-608 are positioned relative to each other in system 600 via structural members, clips, clamps, screws, nuts, bolts, adhesive, and/or other mechanical devices. In some embodiments, first optical element 602, second optical element 604, third optical element 606, and/or fourth optical element 608 are movable relative to each other. Movement of first optical element 602, second optical element 604, and/or third optical element 606 is configured to adjust locations of corresponding spots 690-694 of illumination on target 30. In some embodiments, movement comprises tilting first optical element 602, second optical element 604, and/or third optical element 606, for example. In some embodiments, movement comprises translating or otherwise changing a distance between one or more of first optical element 602, second optical element 604, third optical element 606, and/or fourth optical element 608. Other examples of movement are contemplated.

Phrased another way, spot 690 of illumination 650 corresponding to the illumination from first axis 651 comprises an on axis spot, and a spots 692 and 694 of illumination 650 corresponding to the illumination from second and third axes 662 and 672, respectively, comprise off axis spots. On axis spot 690 and off axis spots 692 and/or 694 are moveable relative to each other. Spots 690-694 of illumination 650 directed at target 30 are configured to be moved relative to each other based on movements of the first, second, third, and/or fourth optical elements (e.g., elements 602-608).

In some embodiments, movement of optical elements 602-608 may be controlled electronically by a processor, such as processor PRO shown in FIG. 3 (and also in FIG. 9 discussed below). Processor PRO may be included in a computing system CS (FIG. 9) and may operate based on computer or machine readable instructions MRI (e.g., as described below related to FIG. 9). Electronic communication may occur by transmitting electronic signals between separate components, transmitting data between separate components of system 600, transmitting values between separate components, and/or other communication. The components of system 600 may communicate via wires or wirelessly via a network, such as the Internet or the Internet in combination with various other networks, like local area networks, cellular networks, or personal area networks, internal organizational networks, and/or other networks.

In some embodiments, one or more actuators (not shown in FIG. 6) may be coupled to and configured to move one or more of optical elements 602-608. The actuators may be coupled to one or more edges of one or more optical elements 602-608 by adhesive, clips, clamps, screws, a collar, and/or other mechanisms. The actuators may be configured to be controlled electronically. Individual actuators may be configured to convert an electrical signal into mechanical displacement. The mechanical displacement is configured to move an optical element 602-608. As an example, one or more of the actuators may be piezoelectric. One or more processors PRO may be configured to control the actuators. One or more processors PRO may be configured to individually control each of the one or more actuators.

Figure 7:
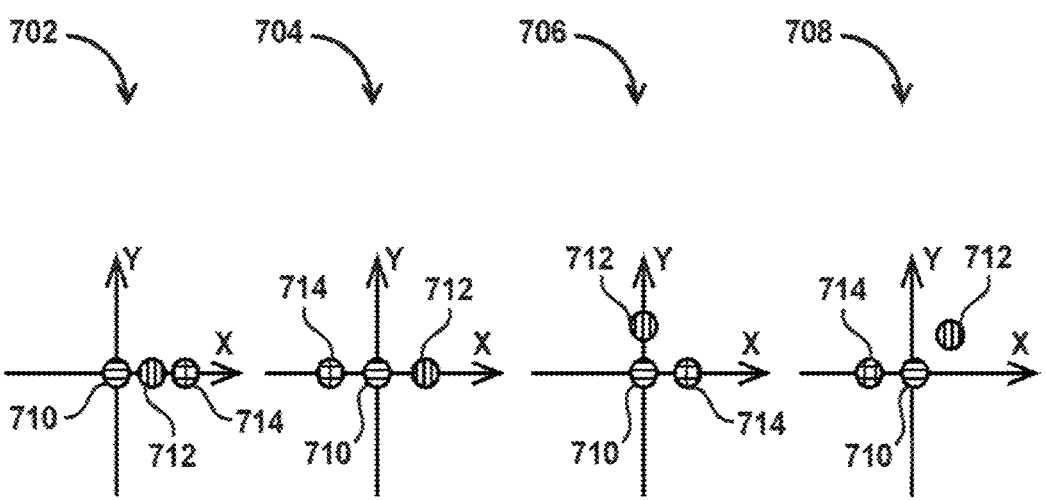
FIG. 7 illustrates various different illumination spot arrangements, according to embodiments.

FIG. 7 illustrates various different illumination spot arrangements 702, 704, 706, and 708. In some embodiments, such as in arrangements 702 and 704, spots 710, 712, and 714 of illumination are aligned linearly. In some embodiments, such as in arrangements 706 and 708, spots 710, 712, and 714 of illumination are arranged in a two dimensional pattern. In FIG. 7, spot 710 comprises an on axis spot, and spots 712 and 714 comprise off axis spots. Arrangement 702 illustrates how both of spots 712 and 714 may be linearly located on one side of spot 710. Arrangement 704 illustrates how both of spots 712 and 714 may be linearly located with spot 710, but with spot 714 on one side of spot 710, and spot 712 on the other side of spot 710. It should be noted that arrangements 702 and 704 illustrate spots 710-714 that lie along the x axis as illustrated, but this could easily be changed so that spots 710-714 lie along the y axis, or some other axis. Arrangement 704 may also be reversed so that spots 712 and 714 lie on opposite sides of spot 710. Arrangement 706 illustrates how spots 710-714 may be arranged in a two dimensional pattern, at right angles to each other in this example. Arrangement 708 illustrates another possible two dimensional pattern that may be formed by spots 710-714. Other examples are contemplated.

The quantity of optical elements shown in FIG. 6 and illumination spots shown in FIG. 7 is not intended to be limiting. The principles described herein may be extended such that, in some embodiments system 600 comprises additional optical elements configured to receive reflected illumination transmitted by previous optical elements, and configured to at least partially reflect received illumination along additional axes to generate additional spots of illumination directed at a target. In addition, FIG. 6 illustrates different diffraction orders 675 for phase intensity measurements. A similar arrangement of components similar to and/or the same as those described above (e.g., the components of system 600) may be formed for a detection axis of a metrology system (e.g., system 10 shown in FIG. 3). The components may be configured such that detection axis radiation is configured to be split with multiple optical elements.

Figure 8:
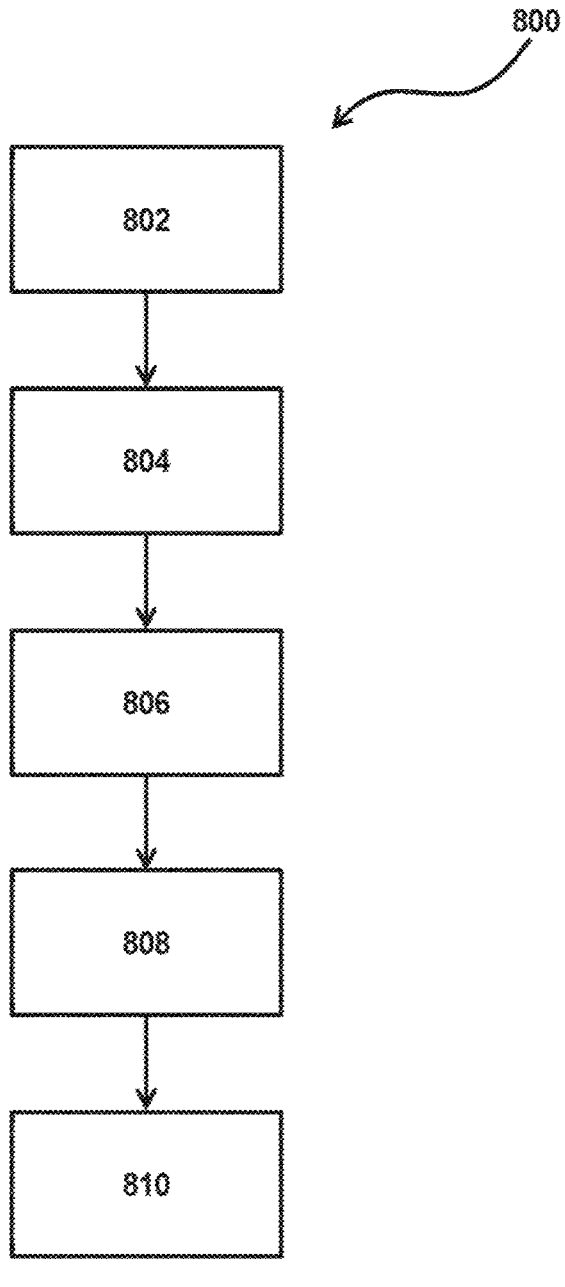
FIG. 8 illustrates a method generating spots of illumination configured to be directed at a target, according to an embodiment.

FIG. 8 illustrates a method 800 for generating spots of illumination configured to be directed at a target. In some embodiments, method 800 is performed as part of an alignment sensing operation in a semiconductor device manufacturing process, for example. In some embodiments, one or more operations of method 800 may be implemented in or by system 600 illustrated in FIG. 6, and/or system 10 illustrated in FIG. 3, a computer system (e.g., as illustrated in FIG. 9 and described below), and/or in or by other systems, for example. In some embodiments, method 800 comprises receiving (operation 802), with a first optical element, illumination from an illumination source along a first axis, reflecting a first portion of the illumination away from the first axis, and transmitting a second portion of the illumination along the first axis; receiving (operation 804), with a second optical element, the first portion of the reflected illumination and at least partially reflecting a third portion of the illumination along a second axis that is at a different angle from the first axis; receiving and fully reflecting (operation 806), with a third optical element, a fourth portion of the illumination along a third axis that is at a different angle from the first axis and the second axis, with the fourth portion of the illumination transmitted by the second optical element; reflecting (operation 808), with a fourth optical element, the illumination received along the first axis, the second axis, and the third axis, in a columnar direction that is substantially perpendicular to the first axis; and receiving (operation 810), with a lens, illumination beams formed by the optical elements and focus the spots of illumination on the target. The second portion, the third portion, and the fourth portion of the illumination are directed toward the target at different angles relative to each other in a pupil plane to create three different spots of illumination on the target.

The operations of method 800 are intended to be illustrative. In some embodiments, method 800 may be accomplished with one or more additional operations not described, and/or without one or more of the operations discussed. For example, in some embodiments, method 800 may include an additional operation comprising determining an adjustment for a semiconductor device manufacturing process. Additionally, the order in which the operations of method 800 are illustrated in FIG. 8 and described herein is not intended to be limiting.

In some embodiments, one or more portions of method 800 may be implemented in and/or controlled by one or more processing devices (e.g., a digital processor, an analog processor, a digital circuit designed to process information, an analog circuit designed to process information, a state machine, and/or other mechanisms for electronically processing information). The one or more processing devices may include one or more devices executing some or all of the operations of method 800 in response to instructions stored electronically on an electronic storage medium. The one or more processing devices may include one or more devices configured through hardware, firmware, and/or software to be specifically designed for execution of one or more of the operations of method 800 (e.g., see discussion related to FIG. 9 below).

At operation 802, a first optical element receives illumination from an illumination source along a first axis. The first optical element reflects a first portion of the illumination away from the first axis, and transmits a second portion of the illumination along the first axis. In some embodiments, the first optical element is the same as or similar to element 602 shown in FIG. 6 and described above. In some embodiments, operation 802 comprises providing the illumination source (e.g., source 2 shown in FIG. 3). The illumination source comprises a single source configured to generate the illumination along the first axis.

At operation 804 a second optical element receives the first portion of the reflected illumination and at least partially reflects a third portion of the illumination along a second axis that is at a different angle from the first axis. In some embodiments, the second optical element is the same as or similar to element 604 shown in FIG. 6 and described above.

At operation 806, a third optical element receives and fully reflects a fourth portion of the illumination along a third axis that is at a different angle from the first axis and the second axis. The fourth portion of the illumination is transmitted by the second optical element. In some embodiments, the third optical element is the same as or similar to element 606 shown in FIG. 6 and described above.

In some embodiments, the first optical element, the second optical element, and the third optical element each comprise a spot mirror. In some embodiments, the first optical element is partially reflective, the second optical element is at least partially reflective, and the third optical element is fully reflective.

At operation 808 a fourth optical element reflects the illumination received along the first axis, the second axis, and the third axis, in a columnar direction that is substantially perpendicular to the first axis. In some embodiments, the fourth optical element comprises a spot mirror cube. In some embodiments, the fourth optical element is the same as or similar to element 608 shown in FIG. 6 and described above.

At an operation 810, a lens receives illumination beams formed by the optical elements and focuses the spots of illumination on the target. In some embodiments, the lens is the same as or similar to lens 610 shown in FIG. 6 and described above. The second portion, the third portion, and the fourth portion of the illumination are directed toward the target at different angles relative to each other in a pupil plane to create three different spots of illumination on the target. A spot of illumination corresponding to the illumination from the first axis comprises an on axis spot, and a spots of illumination corresponding to the illumination from the second and third axes comprise off axis spots. An off-axis spot is configured to reduce or eliminate ghost reflections.

In some embodiments, the spots of illumination are aligned linearly. In some embodiments, the spots of illumination are arranged in a two dimensional pattern.

In some embodiments, the first optical element, the second optical element and the third optical elements are movable relative to each other. Movement of the first optical element, the second optical element, and/or the third optical element is configured to adjust locations of corresponding spots of illumination on the target. In some embodiments, movement comprises tilting the first optical element, the second optical element, and/or the third optical element; and/or changing a distance between one or more of the first optical element, the second optical element, and the third optical element. In some embodiments, a spot of illumination corresponding to the illumination from the first axis comprises an on axis spot, and a spots of illumination corresponding to the illumination from the second and third axes comprise off axis spots. The on axis spot and the off axis spots are moveable relative to each other. The spots of illumination directed at the target are configured to be moved relative to each other based on movements of the first, second, third, and/or fourth optical elements.

In some embodiments, method 800 includes illuminating (and/or otherwise irradiating) a target (e.g., target 30 shown in FIG. 3 and FIG. 6) in a patterned substrate with radiation. The radiation comprises light and/or other radiation separated into illumination spots as described above. The target may comprise one or more structures in the patterned substrate capable of providing a diffraction signal. The target may be included in a layer of a substrate in a semiconductor device structure, for example. In some embodiments, the feature comprises a geometric feature such as a 1D or 2D feature, and/or other geometric features. By way of several non-limiting examples, the feature may comprise a grating, a line, an edge, a fine-pitched series of lines and/or edges, and/or other features.

The radiation may have a target wavelength and/or wavelength range, a target intensity, and/or other characteristics. The target wavelength and/or wavelength range, the target intensity, etc., may be entered and/or selected by a user, determined by the system (e.g., system 10 shown in FIG. 3) based on previous alignment measurements, and/or determined in other ways. In some embodiments, the radiation comprises light and/or other radiation. In some embodiments, the light comprises visible light, infrared light, near infrared light, and/or other light. In some embodiments, the radiation may be any radiation appropriate for interferometry.

The radiation may be generated by a radiation source (e.g., source 2 shown in FIG. 3 and described above). In some embodiments, the radiation may be directed by the radiation source onto a target, sub-portions (e.g., something less than the whole) of a target, multiple targets, and/or onto the substrate in other ways. In some embodiments, the radiation may be directed by the radiation source onto the target in a time varying manner. For example, the radiation may be rastered over a target (e.g., by moving the target under the radiation) such that different portions of the target are irradiated at different times. As another example, characteristics of the radiation (e.g., wavelength, intensity, etc.) may be varied. This may create time varying data envelopes, or windows, for analysis. The data envelopes may facilitate analysis of individual sub-portions of a target, comparison of one portion of a target to another and/or to other targets (e.g., in other layers), and/or other analysis.

In some embodiments, method 800 comprises detecting reflected radiation from the target. Detecting reflected radiation comprises detecting one or more phase and/or amplitude (intensity) shifts in reflected radiation from one or more geometric features of the target. The one or more phase and/or amplitude shifts correspond to one or more dimensions of a target. For example, the phase and/or amplitude of reflected radiation from one side of a target is different relative to the phase and/or amplitude of reflected radiation from another side of the target.

Detecting the one or more phase and/or amplitude (intensity) shifts in the reflected radiation from the target comprises measuring local phase shifts (e.g., local phase deltas) and/or amplitude variations that correspond to different portions of a target. For example, the reflected radiation from a specific area of a target may comprise a sinusoidal waveform having a certain phase and/or amplitude. The reflected radiation from a different area of the target (or a target in a different layer) may also comprise a sinusoidal waveform, but one with a different phase and/or amplitude. Detected reflected radiation also comprises measuring a phase and/or amplitude difference in reflected radiation of different diffraction orders. Detecting the one or more local phase and/or amplitude shifts may be performed using Hilbert transformations, for example, and/or other techniques. Interferometry techniques and/or other operations may be used to measure phase and/or amplitude differences in reflected radiation of different diffraction orders.

In some embodiments, method 800 comprises generating a metrology signal based on the detected reflected radiation from the target. The metrology signal is generated by a sensor (such as detector 4 in FIG. 3, a camera, and/or other sensors) based on light received by the sensor. The metrology signal comprises measurement information pertaining to the target. For example, the metrology signal may be an alignment signal comprising alignment measurement information, and/or other metrology signals. The measurement information (e.g., an alignment value and/or other information) may be determined using principles of interferometry and/or other principles.

The metrology signal comprises an electronic signal that represents and/or otherwise corresponds to the radiation reflected from the target(s). The metrology signal may indicate an alignment value associated with a target, for example, and/or other information. Generating the metrology signal comprises sensing the reflected radiation and converting the sensed reflected radiation into the electronic signal. In some embodiments, generating the metrology signal comprises sensing different portions of the reflected radiation from different areas and/or different geometries of the target, and/or multiple targets, and combining the different portions of the reflected radiation to form the metrology signal. This sensing and converting may be performed by components similar to and/or the same as detector 4 and/or processors PRO shown in FIG. 3, and/or other components.

In some embodiments, method 800 comprises determining an adjustment for a semiconductor device manufacturing process. In some embodiments, method 800 includes determining one or more semiconductor device manufacturing process parameters. The one or more semiconductor device manufacturing process parameters may be determined based on one or more detected phase and/or amplitude variations, an alignment value indicated by the metrology signal, and/or other similar systems, and/or other information. The one or more parameters may include a parameter of the radiation (the radiation used for determining alignment), an alignment value, an alignment inspection location on a layer of a semiconductor device structure, a radiation beam trajectory across a target, and/or other parameters. In some embodiments, process parameters can be interpreted broadly to include a stage position, a mask design, a metrology target design, a semiconductor device design, an intensity of the radiation (used for exposing resist, etc.), an incident angle of the radiation (used for exposing resist, etc.), a wavelength of the radiation (used for exposing resist, etc.), a pupil size and/or shape, a resist material, and/or other parameters.

In some embodiments, method 800 includes determining a process adjustment based on the one or more determined semiconductor device manufacturing process parameters, adjusting a semiconductor device manufacturing apparatus based on the determined adjustment, and/or other operations. For example, if a determined alignment is not within process tolerances, the out of tolerance alignment may be caused by one or more manufacturing processes whose process parameters have drifted and/or otherwise changed so that the process is no longer producing acceptable devices (e.g., alignment measurements may breach a threshold for acceptability). One or more new or adjusted process parameters may be determined based on the alignment determination. The new or adjusted process parameters may be configured to cause a manufacturing process to again produce acceptable devices.

For example, a new or adjusted process parameter may cause a previously unacceptable alignment value to be adjusted back into an acceptable range. The new or adjusted process parameters may be compared to existing parameters for a given process. If there is a difference, that difference may be used to determine an adjustment for an apparatus that is used to produce the devices (e.g., parameter "x" should be increased/decreased/changed so that it matches the new or adjusted version of parameter "x" determined as part of method 800), for example. In some embodiments, method 800 may include electronically adjusting an apparatus (e.g., based on the determined process parameters). Electronically adjusting an apparatus may include sending an electronic signal, and/or other communications to the apparatus, for example, that causes a change in the apparatus. The electronic adjustment may include changing a setting on the apparatus, for example, and/or other adjustments.

Figure 9:
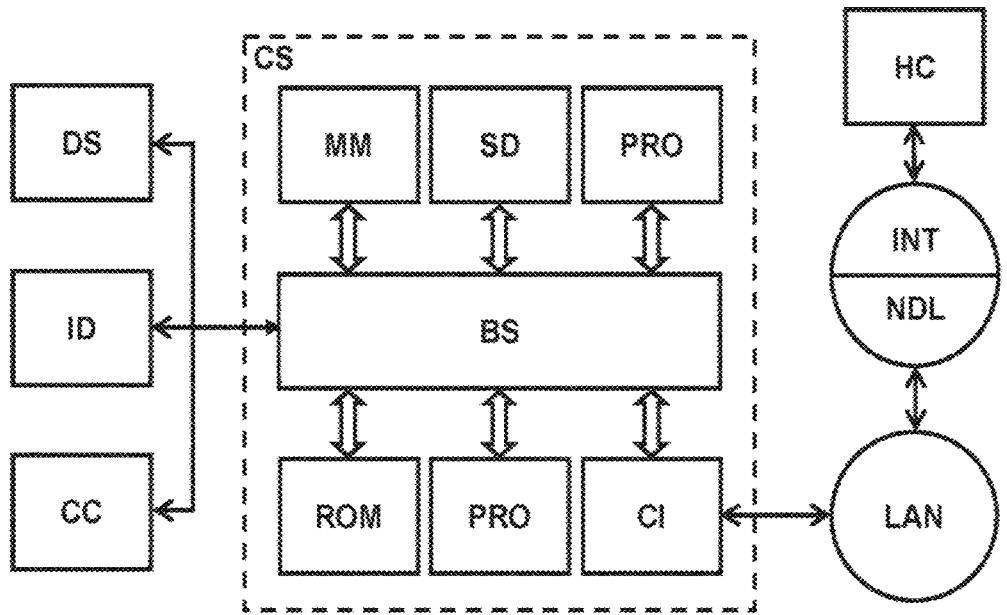
FIG. 9 is a block diagram of an example computer system, according to an embodiment.

FIG. 9 is a diagram of an example computer system CS that may be used for one or more of the operations described herein. Computer system CS includes a bus BS or other communication mechanism for communicating information, and a processor PRO (or multiple processors similar to and/or the same as processor PRO shown in FIG. 3) coupled with bus BS for processing information. Computer system CS also includes a main memory MM, such as a random access memory (RAM) or other dynamic storage device, coupled to bus BS for storing information and instructions to be executed by processor PRO. Main memory MM also may be used for storing temporary variables or other intermediate information during execution of instructions by processor PRO. Computer system CS further includes a read only memory (ROM) ROM or other static storage device coupled to bus BS for storing static information and instructions for processor PRO. A storage device SD, such as a magnetic disk or optical disk, is provided and coupled to bus BS for storing information and instructions.

Computer system CS may be coupled via bus BS to a display DS, such as a cathode ray tube (CRT) or flat panel or touch panel display for displaying information to a computer user. An input device ID, including alphanumeric and other keys, is coupled to bus BS for communicating information and command selections to processor PRO. Another type of user input device is cursor control CC, such as a mouse, a trackball, or cursor direction keys for communicating direction information and command selections to processor PRO and for controlling cursor movement on display DS. This input device typically has two degrees of freedom in two axes, a first axis (e.g., x) and a second axis (e.g., y), that allows the device to specify positions in a plane. A touch panel (screen) display may also be used as an input device.

In some embodiments, all or some of one or more operations described herein may be performed by computer system CS in response to processor PRO executing one or more sequences of one or more instructions contained in main memory MM. Such instructions may be read into main memory MM from another computer-readable medium, such as storage device SD. Execution of the sequences of instructions included in main memory MM causes processor PRO to perform the process steps (operations) described herein. One or more processors in a multi-processing arrangement may also be employed to execute the sequences of instructions contained in main memory MM. In some embodiments, hard-wired circuitry may be used in place of or in combination with software instructions. Thus, the description herein is not limited to any specific combination of hardware circuitry and software.

The term "computer-readable medium" or "machine-readable medium" as used herein refers to any medium that participates in providing instructions to processor PRO for execution. Such a medium may take many forms, including but not limited to, non-volatile media, volatile media, and transmission media. Non-volatile media include, for example, optical or magnetic disks, such as storage device SD. Volatile media include dynamic memory, such as main memory MM. Transmission media include coaxial cables, copper wire and fiber optics, including the wires that comprise bus BS. Transmission media can also take the form of acoustic or light waves, such as those generated during radio frequency (RF) and infrared (IR) data communications. Computer-readable media can be non-transitory, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. Non-transitory computer readable media can have instructions recorded thereon. The instructions, when executed by a computer, can implement any of the operations described herein. Transitory computer-readable media can include a carrier wave or other propagating electromagnetic signal, for example.

Various forms of computer readable media may be involved in carrying one or more sequences of one or more instructions to processor PRO for execution. For example, the instructions may initially be borne on a magnetic disk of a remote computer. The remote computer can load the instructions into its dynamic memory and send the instructions over a telephone line using a modem. A modem local to computer system CS can receive the data on the telephone line and use an infrared transmitter to convert the data to an infrared signal. An infrared detector coupled to bus BS can receive the data carried in the infrared signal and place the data on bus BS. Bus BS carries the data to main memory MM, from which processor PRO retrieves and executes the instructions. The instructions received by main memory MM may optionally be stored on storage device SD either before or after execution by processor PRO.

Computer system CS may also include a communication interface CI coupled to bus BS. Communication interface CI provides a two-way data communication coupling to a network link NDL that is connected to a local network LAN. For example, communication interface CI may be an integrated services digital network (ISDN) card or a modem to provide a data communication connection to a corresponding type of telephone line. As another example, communication interface CI may be a local area network (LAN) card to provide a data communication connection to a compatible LAN. Wireless links may also be implemented. In any such implementation, communication interface CI sends and receives electrical, electromagnetic or optical signals that carry digital data streams representing various types of information.

Network link NDL typically provides data communication through one or more networks to other data devices. For example, network link NDL may provide a connection through local network LAN to a host computer HC. This can include data communication services provided through the worldwide packet data communication network, now commonly referred to as the "Internet" INT. Local network LAN (Internet) may use electrical, electromagnetic or optical signals that carry digital data streams. The signals through the various networks and the signals on network data link NDL and through communication interface CI, which carry the digital data to and from computer system CS, are exemplary forms of carrier waves transporting the information.

Computer system CS can send messages and receive data, including program code, through the network(s), network data link NDL, and communication interface CI. In the Internet example, host computer HC might transmit a requested code for an application program through Internet INT, network data link NDL, local network LAN, and communication interface CI. One such downloaded application may provide all or part of a method described herein, for example. The received code may be executed by processor PRO as it is received, and/or stored in storage device SD, or other non-volatile storage for later execution. In this manner, computer system CS may obtain application code in the form of a carrier wave.

Figure 10:
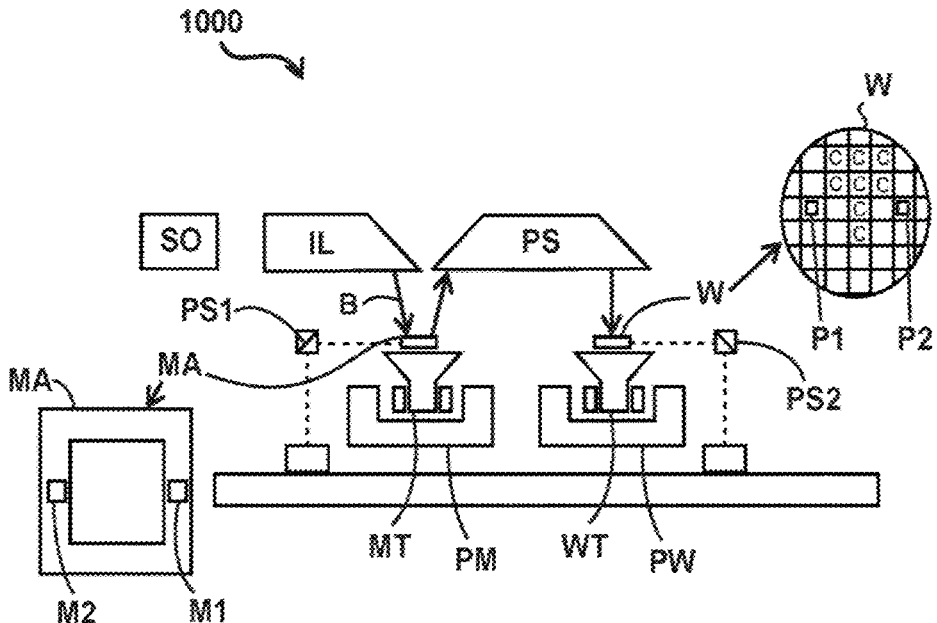
FIG. 10 is a schematic diagram of a lithographic projection apparatus similar to FIG. 1, according to an embodiment.

FIG. 10 schematically depicts an exemplary lithographic projection apparatus similar to and/or the same as the apparatus shown in FIG. 1 that can be used in conjunction with the techniques described herein. The apparatus 1000 comprises an illumination system IL, to condition a beam B of radiation. In this particular case, the illumination system also comprises a radiation source SO; a first object table (e.g., patterning device table) MT provided with a patterning device holder to hold a patterning device MA (e.g., a reticle), and connected to a first positioner PM (working in association with a first position sensor) PS1 to accurately position the patterning device; a second object table (substrate table) WT provided with a substrate holder to hold a substrate W (e.g., a resist-coated silicon wafer), and connected to a second positioner PW (working in association with a second position sensor PS2) to accurately position the substrate; a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means for setting the outer and/or inner radial extent (commonly referred to as σ-outer and σ-inner, respectively) of the intensity distribution in the beam. In addition, it will generally comprise various other components, such as an integrator and a condenser. In this way, the beam B impinging on the patterning device MA has a desired uniformity and intensity distribution in its cross-section.

It should be noted with regard to FIG. 10 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam B subsequently intercepts the patterning device MA, which is held on a patterning device table MT. Having traversed the patterning device MA, the beam B passes through a lens, which focuses the beam B onto a target portion C of the substrate W. With the aid of the second positioning means (and interferometric measuring means), the substrate table WT can be moved accurately, e.g. to position different target portions C in the path of the beam B. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted. However, in the case of a stepper (as opposed to a step-and-scan tool) the patterning device table MT may just be connected to a short stroke actuator, or may be fixed.

The depicted tool (similar to or the same as the tool shown in FIG. 1) can be used in two different modes. In step mode, the patterning device table MT is kept essentially stationary, and an entire patterning device image is projected in one operation (i.e., a single "flash") onto a target portion C. The substrate table WT is then shifted in the x and/or y directions so that a different target portion C can be irradiated by the beam B. In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 11:
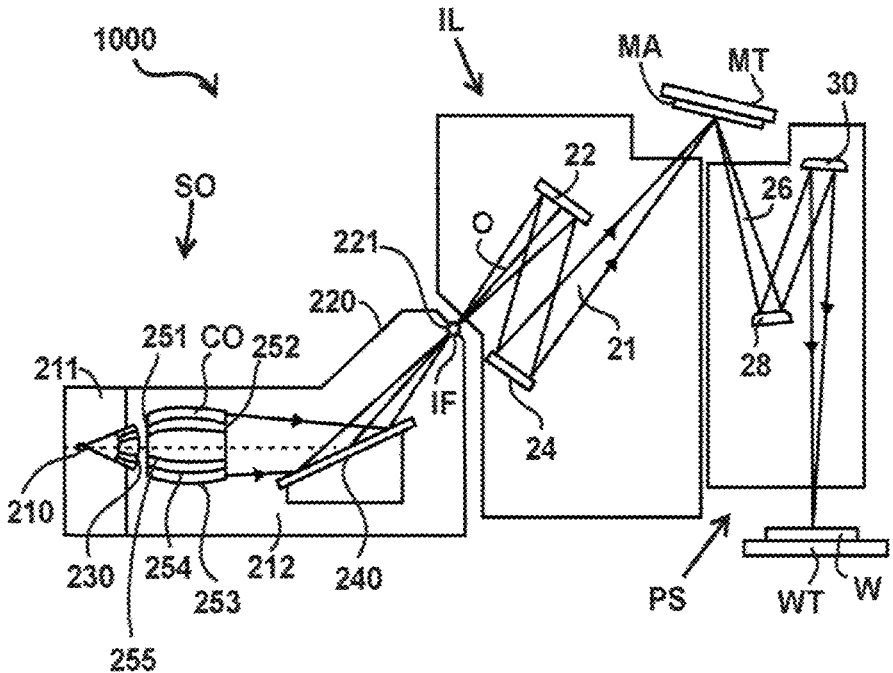
FIG. 11 is a more detailed view of the apparatus in FIG. 10, according to an embodiment.

FIG. 11 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the hot plasma 210 is created to emit radiation in the EUV range of the electromagnetic spectrum. The plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap 230 further indicated herein at least includes a channel structure.

The source chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation beam 21 at the patterning device MA, held by the support structure MT, a patterned beam 26 is formed and the patterned beam 26 is imaged by the projection system PS via reflective elements 28, 330 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 11.

Collector optic CO, as illustrated in FIG. 11, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 12:
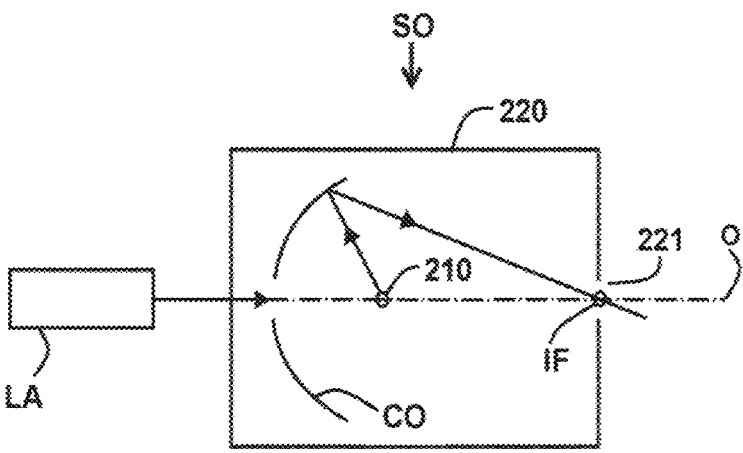
FIG. 12 is a more detailed view of the source collector module of the apparatus of FIG. 10 and FIG. 11, according to an embodiment.

Alternatively, the source collector module SO may be part of an LPP radiation system as shown in FIG. 12. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A system for generating spots of illumination configured to be directed at a target, the system comprising: a first optical element configured to receive illumination from an illumination source along a first axis, reflect a first portion of the illumination away from the first axis, and transmit a second portion of the illumination along the first axis; and a second optical element configured to receive the first portion of the reflected illumination and at least partially reflect a third portion of the illumination along a second axis that is at a different angle from the first axis; wherein the second portion and the third portion of the illumination are directed toward the target at an angle relative to each other in a pupil plane to create two different spots of illumination on the target.

2. The system of clause 1, further comprising: a third optical element configured to receive and fully reflect a fourth portion of the illumination along a third axis that is at a different angle from the first axis and the second axis, the fourth portion of the illumination transmitted by the second optical element; wherein the second portion, the third portion, and the fourth portion of the illumination are directed toward the target at different angles relative to each other in the pupil plane to create three different spots of illumination on the target.

3. The system of any of the previous clauses, wherein a spot of illumination corresponding to the illumination from the first axis comprises an on axis spot, and a spots of illumination corresponding to the illumination from the second and third axes comprise off axis spots.

4. The system of any of the previous clauses, wherein an off-axis spot is configured to reduce or eliminate ghost reflections.

5. The system of any of the previous clauses, wherein the first optical element, the second optical element and the third optical elements are movable relative to each other.

6. The system of any of the previous clauses, wherein movement of the first optical element, the second optical element, and/or the third optical element is configured to adjust locations of corresponding spots of illumination on the target.

7. The system of any of the previous clauses, wherein movement comprises tilting the first optical element, the second optical element, and/or the third optical element; and/or changing a distance between one or more of the first optical element, the second optical element, and the third optical element.

8. The system of any of the previous clauses, wherein the first optical element, the second optical element, and the third optical element each comprise a spot mirror.

9. The system of any of the previous clauses, wherein the first optical element is partially reflective, the second optical element is at least partially reflective, and the third optical element is fully reflective.

10. The system of any of the previous clauses, further comprising a fourth optical element.

11. The system of any of the previous clauses, wherein the fourth optical element is configured to reflect the illumination received along the first axis in a columnar direction that is substantially perpendicular to the first axis.

12. The system of any of the previous clauses, wherein the fourth optical element comprises a spot mirror cube.

13. The system of any of the previous clauses, wherein a spot of illumination corresponding to the illumination from the first axis comprises an on axis spot, and a spots of illumination corresponding to the illumination from the second and third axes comprise off axis spots, and wherein the on axis spot and the off axis spots are moveable relative to each other.

14. The system of any of the previous clauses, wherein the spots of illumination directed at the target are configured to be moved relative to each other based on movements of the first, second, third, and/or fourth optical elements.

15. The system of any of the previous clauses, wherein the spots of illumination are aligned linearly.

16. The system of any of any of the previous clauses, wherein the spots of illumination are arranged in a two dimensional pattern.

17. The system of any of the previous clauses, further comprising the illumination source, the illumination source comprising a single source configured to generate the illumination along the first axis.

18. The system of any of the previous clauses, further comprising a lens configured to receive illumination beams formed by the optical elements and focus the spots of illumination on the target.

19. The system of any of the previous clauses, wherein the first, second, third, and fourth optical elements form a portion of an alignment sensor, and wherein the alignment sensor is a wafer alignment sensor that is used in a semiconductor manufacturing process.

20. The system of any of the previous clauses, further comprising additional optical elements configured to receive reflected illumination transmitted by previous optical elements, and configured to at least partially reflect received illumination along additional axes to generate additional spots of illumination directed at the target.

21. A method for generating spots of illumination configured to be directed at a target, the method comprising: receiving, with a first optical element, illumination from an illumination source along a first axis, reflecting a first portion of the illumination away from the first axis, and transmitting a second portion of the illumination along the first axis; and receiving, with a second optical element, the first portion of the reflected illumination and at least partially reflecting a third portion of the illumination along a second axis that is at a different angle from the first axis; wherein the second portion and the third portion of the illumination are directed toward the target at an angle relative to each other in a pupil plane to create two different spots of illumination on the target.

22. The method of clause 21, further comprising: receiving and fully reflecting, with a third optical element, a fourth portion of the illumination along a third axis that is at a different angle from the first axis and the second axis, the fourth portion of the illumination transmitted by the second optical element; wherein the second portion, the third portion, and the fourth portion of the illumination are directed toward the target at different angles relative to each other in the pupil plane to create three different spots of illumination on the target.

23. The method of any of the previous clauses, wherein a spot of illumination corresponding to the illumination from the first axis comprises an on axis spot, and a spots of illumination corresponding to the illumination from the second and third axes comprise off axis spots.

24. The method of any of the previous clauses, wherein an off-axis spot is configured to reduce or eliminate ghost reflections.

25. The method of any of the previous clauses, wherein the first optical element, the second optical element and the third optical elements are movable relative to each other.

26. The method of any of the previous clauses, wherein movement of the first optical element, the second optical element, and/or the third optical element is configured to adjust locations of corresponding spots of illumination on the target.

27. The method of any of the previous clauses, wherein movement comprises tilting the first optical element, the second optical element, and/or the third optical element; and/or changing a distance between one or more of the first optical element, the second optical element, and the third optical element.

28. The method of any of the previous clauses, wherein the first optical element, the second optical element, and the third optical element each comprise a spot mirror.

29. The method of any of the previous clauses, wherein the first optical element is partially reflective, the second optical element is at least partially reflective, and the third optical element is fully reflective.

30. The method of any of the previous clauses, further comprising providing a fourth optical element.

31. The method of any of the previous clauses, further comprising reflecting, with the fourth optical element, the illumination received along the first axis in a columnar direction that is substantially perpendicular to the first axis.

32. The method of any of the previous clauses, wherein the fourth optical element comprises a spot mirror cube.

33. The method of any of the previous clauses, wherein a spot of illumination corresponding to the illumination from the first axis comprises an on axis spot, and a spots of illumination corresponding to the illumination from the second and third axes comprise off axis spots, and wherein the on axis spot and the off axis spots are moveable relative to each other.

34. The method of any of the previous clauses, wherein the spots of illumination directed at the target are configured to be moved relative to each other based on movements of the first, second, third, and/or fourth optical elements.

35. The method of any of the previous clauses, wherein the spots of illumination are aligned linearly.

36. The method of any of the previous clauses, wherein the spots of illumination are arranged in a two dimensional pattern.

37. The method of any of the previous clauses, further comprising providing the illumination source, the illumination source comprising a single source configured to generate the illumination along the first axis.

38. The method of any of the previous clauses, further comprising providing a lens configured to receive illumination beams formed by the optical elements and focus the spots of illumination on the target.

39. The method of any of the previous clauses, wherein the first, second, third, and fourth optical elements form a portion of an alignment sensor, and wherein the alignment sensor is a wafer alignment sensor that is used in a semiconductor manufacturing process.

40. The method of any of the previous clauses, further comprising providing additional optical elements configured to receive reflected illumination transmitted by previous optical elements, and configured to at least partially reflect received illumination along additional axes to generate additional spots of illumination directed at the target.

41. A non-transitory computer readable medium having instructions thereon, the instructions when executed by a computer, causing operations comprising: receiving, with a first optical element, illumination from an illumination source along a first axis, reflecting a first portion of the illumination away from the first axis, and transmitting a second portion of the illumination along the first axis; and receiving, with a second optical element, the first portion of the reflected illumination and at least partially reflecting a third portion of the illumination along a second axis that is at a different angle from the first axis; wherein the second portion and the third portion of the illumination are directed toward a target at an angle relative to each other in a pupil plane to create two different spots of illumination on the target.

42. The medium of clause 41, the operations further comprising: receiving and fully reflecting, with a third optical element, a fourth portion of the illumination along a third axis that is at a different angle from the first axis and the second axis, the fourth portion of the illumination transmitted by the second optical element; wherein the second portion, the third portion, and the fourth portion of the illumination are directed toward the target at different angles relative to each other in the pupil plane to create three different spots of illumination on the target.

43. The medium of any of the previous clauses, wherein a spot of illumination corresponding to the illumination from the first axis comprises an on axis spot, and a spots of illumination corresponding to the illumination from the second and third axes comprise off axis spots.

44. The medium of any of the previous clauses, wherein an off-axis spot is configured to reduce or eliminate ghost reflections.

45. The medium of any of the previous clauses, wherein the first optical element, the second optical element and the third optical elements are movable relative to each other.

46. The medium of any of the previous clauses, wherein movement of the first optical element, the second optical element, and/or the third optical element is configured to adjust locations of corresponding spots of illumination on the target.

47. The medium of any of the previous clauses, wherein movement comprises tilting the first optical element, the second optical element, and/or the third optical element; and/or changing a distance between one or more of the first optical element, the second optical element, and the third optical element.

48. The medium of any of the previous clauses, wherein the first optical element, the second optical element, and the third optical element each comprise a spot mirror.

49. The medium of any of the previous clauses, wherein the first optical element is partially reflective, the second optical element is at least partially reflective, and the third optical element is fully reflective.

50. The medium of any of the previous clauses, the operations further comprising controlling a fourth optical element.

51. The medium of any of the previous clauses, the operations further comprising reflecting, with the fourth optical element, the illumination received along the first axis in a columnar direction that is substantially perpendicular to the first axis.

52. The medium of any of the previous clauses, wherein the fourth optical element comprises a spot mirror cube.

53. The medium of any of the previous clauses, wherein a spot of illumination corresponding to the illumination from the first axis comprises an on axis spot, and a spots of illumination corresponding to the illumination from the second and third axes comprise off axis spots, and wherein the on axis spot and the off axis spots are moveable relative to each other.

54. The medium of any of the previous clauses, wherein the spots of illumination directed at the target are configured to be moved relative to each other based on movements of the first, second, third, and/or fourth optical elements.

55. The medium of any of the previous clauses, wherein the spots of illumination are aligned linearly.

56. The medium of any of the previous clauses, wherein the spots of illumination are arranged in a two dimensional pattern.

57. The medium of any of the previous clauses, the operations further comprising controlling the illumination source, the illumination source comprising a single source configured to generate the illumination along the first axis.

58. The medium of any of the previous clauses, the operations further comprising controlling a lens configured to receive illumination beams formed by the optical elements and focus the spots of illumination on the target.

59. The medium of any of the previous clauses, wherein the first, second, third, and fourth optical elements form a portion of an alignment sensor, and wherein the alignment sensor is a wafer alignment sensor that is used in a semiconductor manufacturing process.

60. The medium of any of the previous clauses, the operations further comprising controlling additional optical elements configured to receive reflected illumination transmitted by previous optical elements, and configured to at least partially reflect received illumination along additional axes to generate additional spots of illumination directed at the target.

61. A system for generating spots of illumination configured to be directed at a target for a wafer alignment sensor used in a semiconductor manufacturing process, the system configured to generate multiple spots of illumination from a single illumination source, the system configured to reduce or eliminate ghost reflections often prevalent in other wafer alignment sensors, the system comprising: the single illumination source; a first spot mirror included in a first glass plate, the first spot mirror configured to receive illumination from the single illumination source along a first axis, reflect a first portion of the illumination away from the first axis, and transmit a second portion of the illumination along the first axis; a second spot mirror included in a second glass plate, the second spot mirror configured to receive the first portion of the reflected illumination and at least partially reflect a third portion of the illumination along a second axis that is different from the first axis; and a third spot mirror included in a third glass plate, the third spot mirror configured to receive and fully reflect a fourth portion of the illumination along a third axis that is at a different angle from the first axis and the second axis, the fourth portion of the illumination transmitted by the second spot mirror, wherein the second portion, the third portion, and the fourth portion of the illumination are directed toward the target at different angles relative to each other in a pupil plane to create three different spots of illumination on the target corresponding to illumination on the first axis, the second axis, and the third axis.

62. The system of any of the previous clauses, wherein the first spot mirror is partially reflective, the second spot mirror is at least partially reflective, and the third spot mirror is fully reflective.

63. The system of any of the previous clauses, wherein the first glass plate, the second glass plate, and the third glass plate are movable relative to each other; wherein movement of the first glass plate, the second glass plate, and/or the third glass plate is configured to adjust locations of the spots of illumination on the target; and wherein a spot of illumination corresponding to the illumination along the first axis comprises an on-axis spot, and a spots of illumination corresponding to the illumination along the second axis and the third axis comprise an off-axis spot.

64. The system of any of the previous clauses, wherein the third spot mirror is configured to reflect the illumination received along the first axis and the second axis in a columnar direction that is substantially perpendicular to the first axis.

65. The system of any of the previous clauses, further comprising a detection axis, wherein the detection axis is configured to be split with multiple optical elements.

66. The system of any of the previous clauses, further comprising additional optical elements configured to receive reflected illumination transmitted by previous optical elements, and configured to at least partially reflect received illumination along additional axes to generate additional spots of illumination directed at the target.

The concepts disclosed herein may be associated with any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers. In addition, the combination and sub-combinations of disclosed elements may comprise separate embodiments.

The descriptions above are intended to be illustrative, not limiting. Thus, it will be apparent to one skilled in the art that modifications may be made as described without departing from the scope of the claims set out below.

The invention claimed is:

1. A system for generating spots of illumination configured to be directed at a target, the system comprising:
   a first optical element configured to receive illumination from an illumination source along a first axis, reflect a first portion of the illumination away from the first axis, and transmit a second portion of the illumination along the first axis; and
   a second optical element configured to receive the first portion of the reflected illumination and at least partially reflect a third portion of the illumination along a second axis that is at a different angle from the first axis,
   wherein the second and the third portion of the illumination are directed toward the target at an angle relative to each other in a pupil plane to create two different spots of illumination on the target.

2. The system of claim 1, further comprising a third optical element configured to receive and fully reflect a fourth portion of the illumination along a third axis that is at a different angle from the first axis and the second axis, the fourth portion of the illumination transmitted by the second optical element,
   wherein the second portion, the third portion, and the fourth portion of the illumination are directed toward the target at different angles relative to each other in the pupil plane to create three different spots of illumination on the target.

3. The system of claim 2, wherein a spot of illumination corresponding to the illumination from the first axis comprises an on axis spot, and a spot of illumination corresponding to the illumination from each of the second and third axes comprise off axis spots.

4. The system of claim 3, wherein an off-axis spot of the off axis spots is configured to reduce or eliminate ghost reflections.

5. The system of claim 2, wherein the first optical element, the second optical element and the third optical element are movable relative to each other.

6. The system of claim 5, wherein movement of the first optical element, the second optical element, and/or the third optical element is configured to adjust locations of corresponding spots of illumination on the target.

7. The system of claim 5, wherein movement comprises:
   tilting the first optical element, the second optical element, and/or the third optical element; and/or changing a distance between at least two optical elements selected from the first optical element, the second optical element, and the third optical element.

8. The system of claim 2, further comprising a fourth optical element.

9. The system of claim 8, wherein the fourth optical element is configured to reflect the illumination received along the first axis in a columnar direction that is substantially perpendicular to the first axis.

10. The system of claim 8, wherein the fourth optical element comprises a spot mirror cube.

11. The system of claim 8, wherein the first, second, third, and fourth optical elements form a portion of an alignment sensor, and wherein the alignment sensor is a wafer alignment sensor configured for use in a semiconductor manufacturing process.

12. The system of claim 2, wherein a spot of illumination corresponding to the illumination from the first axis comprises an on axis spot, and a spot of illumination corresponding to the illumination from each of the second and third axes comprise off axis spots, and wherein the on axis spot and the off axis spots are moveable relative to each other.

13. The system of claim 12, wherein the spots of illumination directed at the target are configured to be moved relative to each other based on movement of the first, second, and/or third optical elements.

14. The system of claim 1, wherein the first optical element and the second optical element each comprise a spot mirror.

15. The system of claim 14, wherein the first optical element is partially reflective and the second optical element is at least partially reflective.

16. The system of claim 1, wherein the spots of illumination are aligned linearly.

17. The system of claim 1, wherein the spots of illumination are arranged in a two dimensional pattern.

18. The system of claim 1, further comprising the illumination source, the illumination source comprising a single source configured to generate the illumination along the first axis.

19. The system of claim 1, further comprising a lens configured to receive illumination beams formed by the optical elements and focus the spots of illumination on the target.

20. The system of claim 1, further comprising additional optical elements configured to receive reflected illumination transmitted by previous optical elements, and configured to at least partially reflect received illumination along additional axes to generate additional spots of illumination directed at the target.

* * * * *